(12) United States Patent
Levy et al.

(10) Patent No.: US 11,469,225 B2
(45) Date of Patent: Oct. 11, 2022

(54) DEVICE INTEGRATION SCHEMES LEVERAGING A BULK SEMICONDUCTOR SUBSTRATE HAVING A <111> CRYSTAL ORIENTATION

(71) Applicant: GLOBALFOUNDRIES U.S. Inc., Santa Clara, CA (US)

(72) Inventors: Mark Levy, Williston, VT (US); Jeonghyun Hwang, Ithaca, NY (US); Siva P. Adusumilli, South Burlington, VT (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

(21) Appl. No.: 17/072,649

(22) Filed: Oct. 16, 2020

(65) Prior Publication Data

US 2022/0122963 A1    Apr. 21, 2022

(51) Int. Cl.
*H01L 27/06* (2006.01)
*H01L 29/20* (2006.01)
*H01L 21/8258* (2006.01)
*H01L 29/16* (2006.01)
*H01L 29/06* (2006.01)
*H01L 29/04* (2006.01)

(52) U.S. Cl.
CPC ...... *H01L 27/0605* (2013.01); *H01L 21/8258* (2013.01); *H01L 27/0623* (2013.01); *H01L 29/045* (2013.01); *H01L 29/0649* (2013.01); *H01L 29/16* (2013.01); *H01L 29/2003* (2013.01)

(58) Field of Classification Search
CPC ............. H01L 27/0605; H01L 27/8258; H01L 27/0623; H01L 29/045; H01L 29/0649; H01L 29/16; H01L 29/2003
USPC .......................................... 257/288; 438/197
See application file for complete search history.

(56) References Cited

U.S. PATENT DOCUMENTS 7,217,606 B2    5/2007  Forbes et al.
8,212,294 B2    7/2012  Hoke et al.
(Continued)

OTHER PUBLICATIONS

Mike Cooke, "Wafer bonding to integrate silicon, gallium arsenide, and gallium nitride" Semiconductor Today, Jul. 26, 2016, retrieved from the internet at www.semiconductor-today.com/news_items/2016/jul/smart_260716.shtml.

(Continued)

*Primary Examiner* — Thinh T Nguyen
(74) *Attorney, Agent, or Firm* — Thompson Hine LLP; Anthony Canale (57) ABSTRACT

Structures including devices, such as transistors, integrated on a bulk semiconductor substrate and methods of forming a structure including devices, such as transistors, integrated on a bulk semiconductor substrate. The bulk semiconductor substrate contains a single-crystal semiconductor material having a diamond crystal lattice structure and a <111> crystal orientation. A first transistor is formed in a first device region of the bulk semiconductor substrate, and a second transistor is formed in a second device region of the bulk semiconductor substrate. The second transistor includes a layer stack on the bulk semiconductor substrate, and the layer stack includes a layer comprised of a III-V compound semiconductor material.

20 Claims, 6 Drawing Sheets

(56) References Cited

U.S. PATENT DOCUMENTS

| | | | |
|---|---|---|---|
| 8,665,013 | B2 | 3/2014 | Saunders |
| 8,823,146 | B1 | 9/2014 | Hoke |
| 9,171,911 | B2 | 10/2015 | Zhou et al. |
| 9,356,045 | B2 | 5/2016 | Comeau et al. |
| 9,685,545 | B2 | 6/2017 | Tipirneni et al. |
| 10,312,131 | B2 | 6/2019 | Lidow et al. |
| 2011/0180857 | A1* | 7/2011 | Hoke ................ H01L 21/76251 257/255 |
| 2011/0212595 | A1* | 9/2011 | Hu et al. ............... H01L 21/761 438/430 |
| 2013/0146893 | A1* | 7/2013 | Thei et al. .......... H01L 27/0617 |
| 2014/0231870 | A1* | 8/2014 | Hoke ................... H01L 29/045 257/183 |
| 2019/0371886 | A1 | 12/2019 | Radosavljevic et al. |

OTHER PUBLICATIONS

R. Ishito, K. Ono and S. Matsumoto, "Si (100)-GaN/Si (111) low temperature wafer bonding process for 3D power supply on chip," 2019 IEEE CPMT Symposium Japan (ICSJ), Kyoto, Japan, 2019, pp. 151-152.

K. Lee et al., "GaN Devices on a 200 mm Si Platform Targeting Heterogeneous Integration," in IEEE Electron Device Letters, vol. 38, No. 8, pp. 1094-1096, Aug. 2017.

TW Examination Report, Taiwan Patent Application No. 110134592 issued by the Taiwan Intellectual Property Office; pp. 1-10 (dated May 16, 2022).

\* cited by examiner

FIG. 10

DEVICE INTEGRATION SCHEMES LEVERAGING A BULK SEMICONDUCTOR SUBSTRATE HAVING A <111> CRYSTAL ORIENTATION

BACKGROUND

The present invention relates to semiconductor device fabrication and integrated circuits and, more specifically, to structures including devices, such as transistors, integrated on a bulk semiconductor substrate and methods of forming a structure including devices, such as transistors, integrated on a bulk semiconductor substrate.

High-voltage power electronic devices, such as high-electron-mobility transistors, may be fabricated using III-V compound semiconductors to exploit their material properties, such as a carrier mobility that is greater than the carrier mobility of silicon. III-V compound semiconductors include Group III elements (aluminum, gallium, indium) combined with Group V elements (nitrogen, phosphorus, arsenic, antimony). A high-electron-mobility transistor may include a heterojunction between crystalline III-V compound semiconductor materials having different band gaps, such as a heterojunction between binary gallium nitride and trinary aluminum-gallium nitride. During operation, a two-dimensional electron gas is formed near an interface at the heterojunction and defines the channel of the high-electron-mobility transistor.

The integration of high-electron-mobility transistors with either field-effect transistors or heterojunction bipolar transistors formed by complementary-metal-oxide-semiconductor (CMOS) processing on the same chip has proven to be a complex process. Integration may be achieved by wafer bonding or through the use of engineered or hybrid substrates, which by their nature lend significant complexity to processes integrating high-electron-mobility transistors with these other types of transistors.

Structures including devices, such as transistors, integrated on a bulk semiconductor substrate and methods of forming a structure including devices, such as transistors, integrated on a bulk semiconductor substrate are needed.

SUMMARY

In an embodiment of the invention, a structure includes a bulk semiconductor substrate comprised of a single-crystal semiconductor material having a diamond crystal lattice structure and a <111> crystal orientation. The bulk semiconductor substrate has a first device region and a second device region. The structure includes a first transistor in the first device region of the bulk semiconductor substrate, and a second transistor in the second device region of the bulk semiconductor substrate. The second transistor includes a layer stack on the bulk semiconductor substrate, and the layer stack includes a layer comprised of a III-V compound semiconductor material.

In an embodiment of the invention, a method includes providing a bulk semiconductor substrate comprised of a single-crystal semiconductor material having a diamond crystal lattice structure and a <111> crystal orientation. The method further includes forming a first transistor in a first device region of the bulk semiconductor substrate, forming a layer stack including a layer comprised of a III-V compound semiconductor material in a second device region of the bulk semiconductor substrate, and forming a second transistor using the layer stack.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
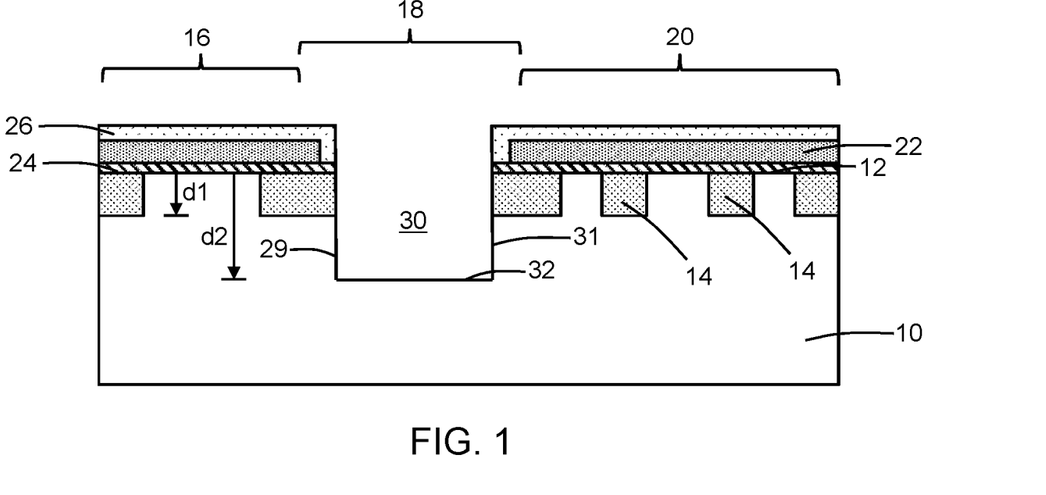
FIGS. 1-6 are cross-sectional views of a structure at successive fabrication stages of a processing method in accordance with embodiments of the invention.

With reference to FIG. 1 and in accordance with embodiments of the invention, a semiconductor substrate 10 is provided that contains a single-crystal semiconductor material, such as single-crystal silicon. The semiconductor substrate 10 has a top surface 12, which may be planar. The semiconductor substrate 10 is a bulk substrate containing a single-crystal semiconductor material (e.g., single-crystal silicon). In an embodiment, the single-crystal semiconductor material of the semiconductor substrate 10 may have a diamond crystal lattice structure with a <111> crystal orientation as specified by Miller indices. In an embodiment, the semiconductor substrate 10 may contain single-crystal silicon with a diamond crystal lattice structure having a <111> crystal orientation. For a semiconductor substrate 10 having a <111> crystal orientation, the (111) crystallographic plane is parallel to the top surface 12 of the semiconductor substrate 10, and the [111] crystallographic direction is normal to the (111) plane. The (100) crystallographic axes do not lie in the plane of the top surface 12. The semiconductor substrate 10 may be characterized as a non-silicon-on-insulator substrate (i.e., a non-SOI) substrate) that lacks a buried oxide layer characteristic of a silicon-on-insulator (SOI) substrate. In an embodiment, the semiconductor substrate 10 may be fully comprised of semiconductor material with a <111> crystal orientation.

Shallow trench isolation regions 14 are formed that extend from the top surface 12 of the semiconductor substrate 10 into the semiconductor substrate 10. The shallow trench isolation regions 14 may contain a dielectric material deposited by chemical vapor deposition into trenches etched in the semiconductor substrate 10, polished, and deglazed. The dielectric material contained in the shallow trench isolation regions 14 may comprise silicon dioxide, silicon nitride, silicon carbide, silicon-rich silicon dioxide, or a combination of two or more of these materials. The shallow trench isolation regions 14 may extend to a depth, d1, relative to the top surface 12 into the semiconductor substrate 10. The shallow trench isolation regions 14 surround and define multiple device regions 16, 18, 20. In an embodiment, the top surface 12 in the device region 18 may be coplanar with the top surface 12 in the device region 16 and also coplanar with the top surface 12 in the device region 20.

A gate conductor layer 22 comprised of, for example, doped polycrystalline silicon (i.e., doped poly silicon) and a gate dielectric layer 24 comprised of an electrical insulator, such as silicon dioxide, are formed on the semiconductor substrate 10. These layers 22, 24 are formed on the top surface 12 in all of the device regions 16, 18, 20.

A hardmask 26 may be formed over the layers 22, 24 on the semiconductor substrate 10 and patterned to include an opening generally located over the device region 18. The hardmask 26 may be comprised of a dielectric material, such as silicon nitride, and may be patterned by lithography and etching processes. The section of the gate conductor layer 22 and gate dielectric layer 24 exposed by the opening in the hardmask 26 may be removed by etching with an etching process, such as a reactive ion etching process, which exposes the top surface 12 of the semiconductor substrate 10 in device region 18.

A trench 30 is subsequently formed in the semiconductor substrate 10 at the location of the opening in the hardmask 26 by etching with another etching process, such as a reactive ion etching process. The trench 30 may extend to a trench bottom located at a surface 32 of the semiconductor substrate 10 and may have side surfaces or sidewalls 29, 31. The trench 30 may be surrounded by the shallow trench isolation regions 14 defining the device region 18. The surface 32 may be located at a depth, d2, in the semiconductor substrate 10 relative to the top surface 12 that is greater than the depth, d1, of the shallow trench isolation regions 14. The hardmask 26 protects the sections of the gate conductor layer 22 and gate dielectric layer 24 in the device region 16 and the device region 20 during the etching processes. In an embodiment, the surface 32 may be planar and lack topography. In an embodiment, the top surface 12 may be planar, the surface 32 may be planar, and the planes of the top surface 12 and the surface 32 may be parallel.

Figure 2:
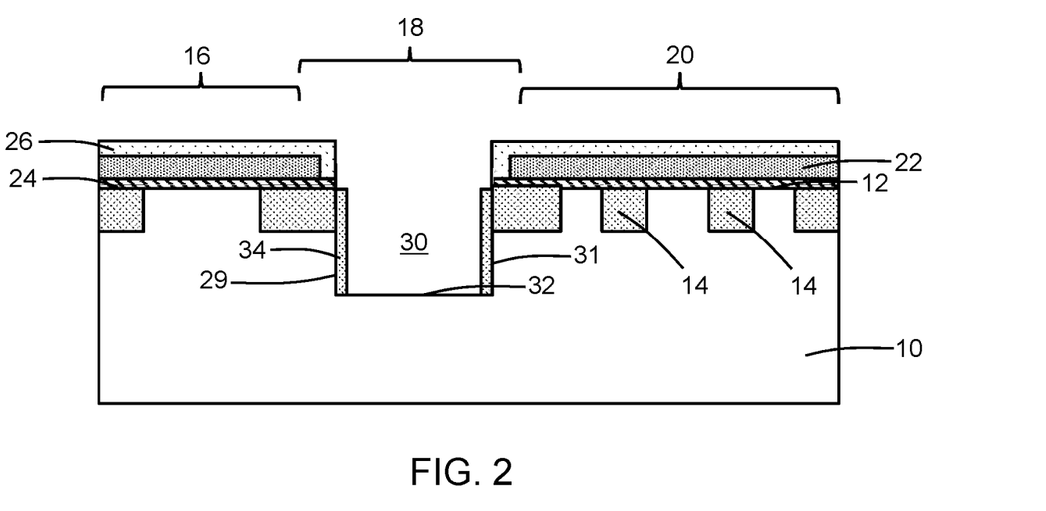

With reference to FIG. 2 in which like reference numerals refer to like features in FIG. 1 and at a subsequent fabrication stage of the processing method, sidewall spacers 34 are formed adjacent to the sidewalls 29, 31 of the trench 30. The sidewall spacers 34 may extend from the top surface 12 of the semiconductor substrate 10 to the surface 32 at the bottom of the trench 30. The sidewall spacers 34 may be formed by depositing a liner layer comprised of a dielectric material (e.g., silicon nitride) and etching the deposited liner layer with an anisotropic etching process, such as a reactive ion etching process.

Figure 3:
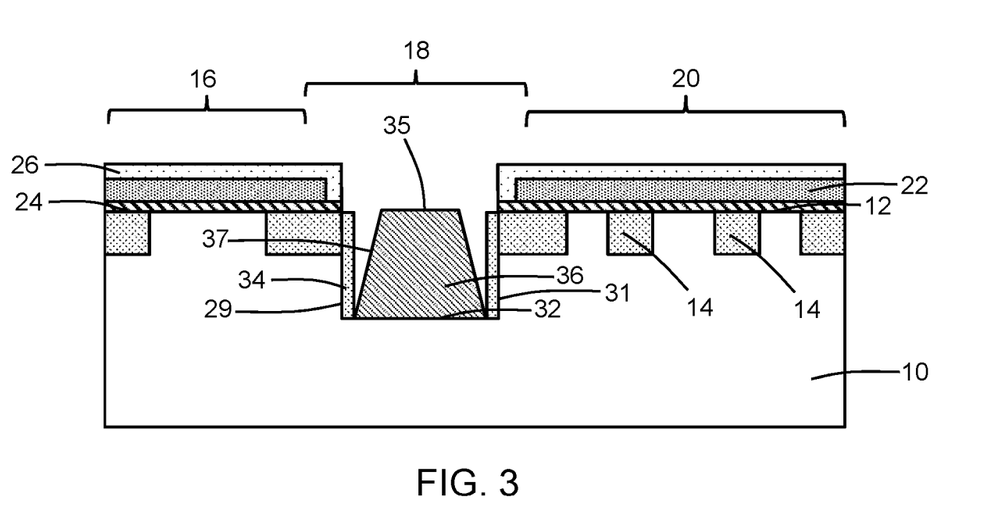
Figure 3A:
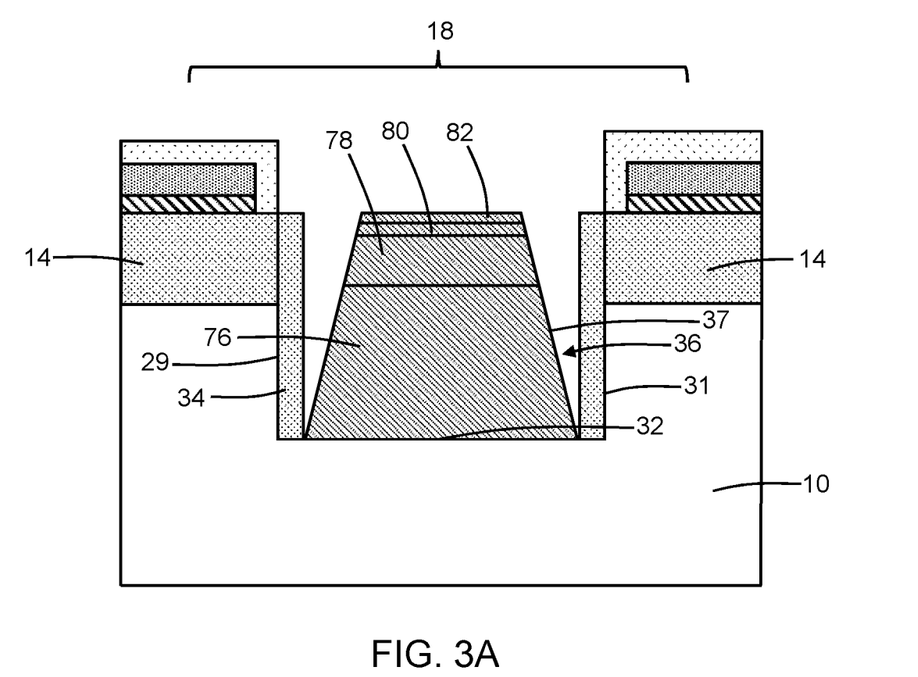
FIG. 3A is an enlarged cross-sectional view of a portion of FIG. 3 in accordance with embodiments of the invention.

With reference to FIGS. 3, 3A in which like reference numerals refer to like features in FIG. 2 and at a subsequent fabrication stage of the processing method, a layer stack 36 containing one or more compound semiconductor layers is formed on the surface 32 of the semiconductor substrate 10 that is located inside the trench 30. In an embodiment, the layer stack 36 may include at least one crystalline layer comprised of a III-V compound semiconductor material. In an embodiment, the layer stack 36 may include at least one crystalline layer comprised of a binary III-V compound semiconductor material. In an embodiment, the layer stack 36 may include at least one crystalline layer comprised of a ternary III-V compound semiconductor material. In an embodiment, the layer stack 36 may include multiple crystalline layers comprised of different III-V compound semiconductor materials. In an embodiment, the layer stack 36 may include at least one crystalline layer comprised of a binary III-V compound semiconductor material and at least one crystalline layer comprised of a ternary III-V compound semiconductor material. In an embodiment, the layer stack 36 may include one or more crystalline layers that contain gallium nitride or a ternary III-V compound semiconductor material based on gallium nitride (e.g., aluminum gallium nitride). In an embodiment, the layer stack 36 may include one or more crystalline layers that contain gallium and nitrogen.

The layer stack 36 may be formed by an epitaxial growth process. Each layer of the layer stack 36 may have a crystal structure that is single crystal or, alternatively, a crystal structure that is substantially single crystal with varying levels of crystalline defectivity present. The <111> crystal orientation of the semiconductor material (e.g., single-crystal silicon) of the semiconductor substrate 10 promotes epitaxial growth of the III-V compound semiconductor material(s), such as gallium nitride, of the layer stack 36 with low crystalline defectivity through closer lattice matching than possible with substrates having a <100> crystal orientation. In particular, the atoms on the surface plane of the semiconductor substrate 10 with a <111> crystal orientation are arranged in hexagons, which may lattice match reasonably well with the crystal structure of one or more of the compound semiconductor materials (e.g., the wurtzite crystal structure of gallium nitride that is based on a binary hexagonal close-packed crystal system) in the layer stack 36.

In an embodiment, the layer stack 36 may be formed by a selective epitaxial growth process in which semiconductor material does not form on dielectric surfaces, such as the hardmask 26 and the sidewall spacers 34. In an embodiment, the layer stack 36 may be formed by a non-selective epitaxial growth process in which semiconductor material is deposited and patterned by lithography and etching processes. In an embodiment, the sidewalls 37 of the layer stack 36 may be located adjacent to, and spaced from, the trench sidewalls 29, 31 and, in that instance, the trench 30 may be substantially filled by the layer stack 36. In the representative embodiment, the layer stack 36 has sidewalls 37 that are inwardly inclined away from the trench sidewalls 29, 31 to define, for example, a trapezoidal shape and to space the sidewalls 37 from the trench sidewalls 29, 31. In an embodiment, the sidewalls 37 may converge at a top surface 35 of the layer stack 36 that may be coplanar or substantially coplanar with the top surface 12 of the semiconductor substrate 10. Isolation regions (not shown) may be formed at the top surface 35 of the layer stack 36 by, for example, a masked implantation of either nitrogen or argon.

In an embodiment and as best shown in FIG. 3A, the layer stack 36 may include a buffer layer 76, a channel layer 78, a spacer layer 80, and a barrier layer 82. The layers 76, 78, 80, 82 may be serially formed using an epitaxial growth process, such as metalorganic chemical vapor deposition. The layers 76, 78, 80, 82 may each have a crystal structure that is single crystal or, alternatively, a crystal structure that is substantially single crystal with varying levels of crystalline defectivity present. One or more of the layers 76, 78, 80, 82 may include multiple sub-layers characterized by varying composition or doping. The buffer layer 76 may contain a III-V compound semiconductor material, such as gallium nitride, that is tailored in terms of material composition, doping, and/or layer thickness to accommodate lattice mismatch between the material of the semiconductor substrate 10 and the material of the channel layer 78. The channel layer 78, which is disposed over the buffer layer 76, may contain a III-V compound semiconductor material, such as gallium nitride. The spacer layer 80 and the barrier layer 82 are disposed over the channel layer 78 with the spacer layer 80 between the channel layer 78 and the barrier layer 82. The spacer layer 80 may be thin and may contain a III-V compound semiconductor, such as aluminum nitride. The barrier layer 82 may contain a III-V compound semiconductor, such as aluminum gallium nitride, aluminum nitride or indium aluminum nitride, that has an heterogenous interface with the channel layer 78 of different composition. The spacer layer 80 and barrier layer 82, along with the material properties of the channel layer 78, contribute to creating a two-dimensional electron gas, during device operation, at the heterogenous interface that is filled with highly-mobile and abundant electrons.

Figure 4:
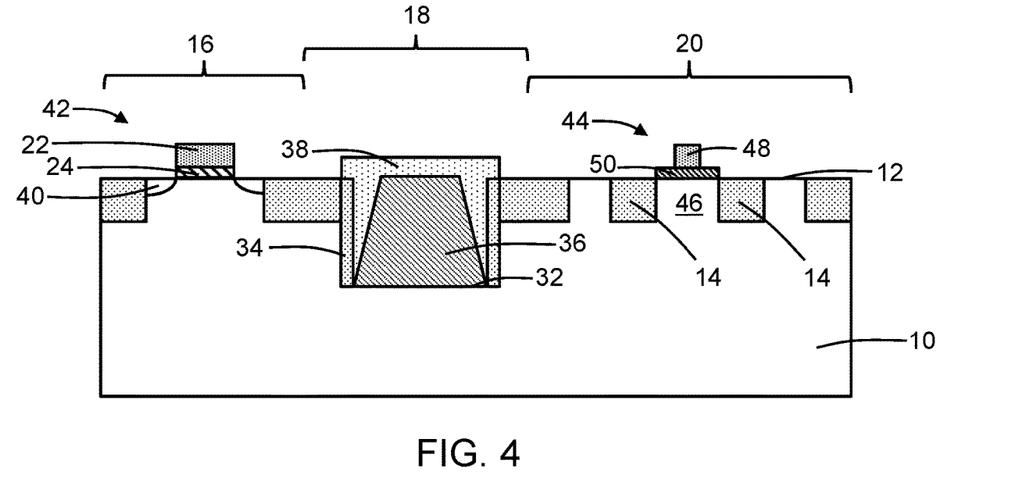

With reference to FIG. 4 in which like reference numerals refer to like features in FIG. 3 and at a subsequent fabrication stage of the processing method, a dielectric layer 38 may be deposited and patterned by photolithography and etching processes such that the layer stack 36 in the device region 18 is covered. The hardmask 26 is removed from the device region 16 and the device region 20 by an etching process, after the dielectric layer 38 is deposited and patterned, to expose the gate conductor layer 22 and gate dielectric layer 24.

The gate conductor layer 22 and gate dielectric layer 24 may be subsequently patterned by photolithography and etching processes to define a gate structure of a field-effect transistor 42 in the device region 16. The gate conductor layer 22 and gate dielectric layer 24 are removed from the device region 20 during patterning. Additional elements of the field-effect transistor 42 may be fabricated by complementary-metal-oxide (CMOS) processing to form a device structure in the device region 16 of the semiconductor substrate 10. The field-effect transistor 42 may additionally include source/drain regions 40, and a channel region beneath the gate structure. The channel region and the source/drain regions 40 of the field-effect transistor 42 contain respective portions of the single-crystal semiconductor material of the semiconductor substrate 10. The source/drain regions 40 are positioned at least in part beneath the top surface 12, and the channel region is positioned beneath the top surface 12 generally between the source/drain regions 40. The patterned gate conductor layer 22 and gate dielectric layer 24 contained in the gate structure of the field-effect transistor 42 may be positioned as device layers on and above the top surface 12 of the semiconductor substrate 10. In an embodiment, the patterned gate dielectric layer 24 contained in the gate structure of the field-effect transistor 42 may be positioned as a device layer directly on the top surface 12 of the semiconductor substrate 10.

A bipolar junction transistor 44 may be fabricated as a device structure in the device region 20 of the semiconductor substrate 10. The bipolar junction transistor 44 may include multiple terminals in the form of a collector 46 defined in the semiconductor substrate 10, an emitter 48, and a base layer 50 arranged between the collector 46 and emitter 48. In alternative embodiments, a collector-up bipolar junction transistor may be formed with the emitter arranged as the terminal in the semiconductor substrate 10. The emitter 48 and the base layer 50 may be positioned as device layers on and above the top surface 12 of the semiconductor substrate 10. In an embodiment, the base layer 50 may be positioned as a device layer directly on the top surface 12 of the semiconductor substrate 10. The collector 46, which contains a portion of the semiconductor material of the semiconductor substrate 10, may be positioned in the semiconductor substrate 10 at least in part, and preferably fully, beneath the top surface 12. The base layer 50 may contain single-crystal semiconductor material (e.g., silicon-germanium) that is epitaxially grown on the top surface 12 of the semiconductor substrate 10. In an embodiment, the collector 46 and emitter 48 may contain n-type semiconductor materials and the base layer 50 may contain p-type semiconductor material to define an NPN transistor. The bipolar junction transistor 44 may be formed by bipolar-complementary-metal-oxide (BiCMOS) processing, which is variant of CMOS processing.

The field-effect transistor 42 and the bipolar junction transistor 44 constitute different types or classifications of transistor structures. A difference between the field-effect transistor 42 and the bipolar junction transistor 44 is that only majority charge carriers flow in the field-effect transistor 42, whereas both majority and minority charge carriers flow in the bipolar junction transistor 44. The field-effect transistor 42 and the bipolar junction transistor 44 do not include any layers of silicon carbide in their respective constructions and, therefore, are free of silicon carbide. The field-effect transistor 42 and the bipolar junction transistor 44 are both formed on semiconductor material characterized by the same <111> crystal orientation as the semiconductor material used to form the layer stack 36.

Figure 5:
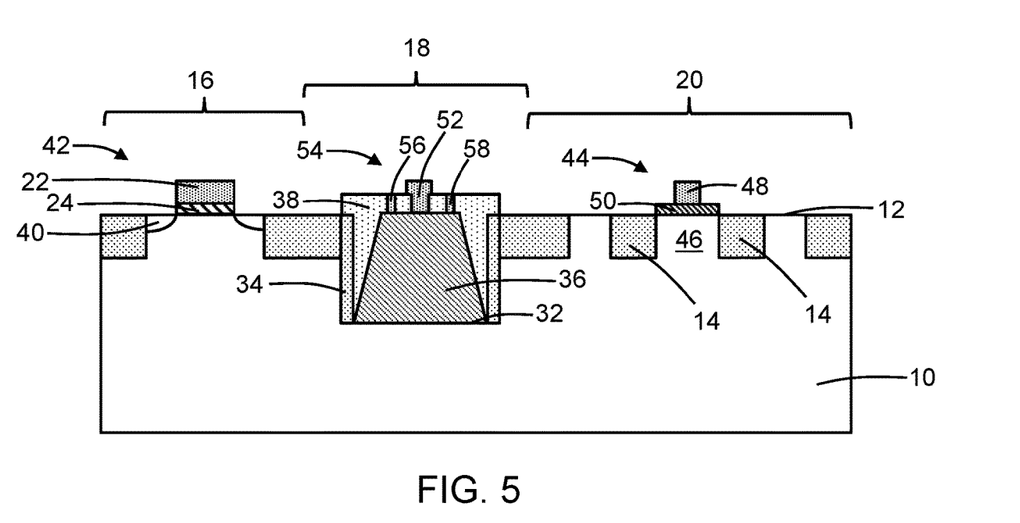

With reference to FIG. 5 in which like reference numerals refer to like features in FIG. 4 and at a subsequent fabrication stage of the processing method, a transistor 54 is formed as a device structure using the layer stack 36. To that end, the dielectric layer 38 is patterned by photolithography and etching processes in device region 18 to define an opening in which a gate electrode 52 of the transistor 54 is formed. The gate electrode 52 may be comprised of a metal, such as a metal nitride, that is deposited and patterned with lithography and etching processes to define a given shape. A source region 56 and a drain region 58 of the transistor 54 may be formed by patterning openings in the dielectric layer 38 by lithography and etching processes, and then forming a metal, such as a metal nitride, in the patterned openings. Metal atoms from the source region 56 and drain region 58 may diffuse into the layer stack 36.

The transistor 54 is not formed by CMOS processes and, therefore, may be considered to be a non-CMOS transistor. In an embodiment, the transistor 54 may be a high-electron-mobility transistor (HEMT). In an embodiment, the transistor 54 may be a metal-insulator-semiconductor high-electron-mobility transistor (MISHEMT). In an embodiment, the transistor 54 may be a metal-oxide-semiconductor high-electron-mobility transistor (MOSHEMT).

Although the <111> crystal orientation of the semiconductor material (e.g., single-crystal silicon) of the semiconductor substrate 10 enables the epitaxial growth of the III-V compound semiconductor material(s) of the layer stack 36 with low crystalline defectivity, the field-effect transistor 42 and/or the bipolar junction transistor 44 may exhibit non-optimized electrical performance due to the <111> crystal orientation in comparison to comparable transistors formed on semiconductor substrates of other crystal orientations. Many of the structural and electronic properties of a single-crystal semiconductor substrate are highly anisotropic and dependent on crystal orientation. Nonetheless, the implementation of the semiconductor substrate 10 with a <111> crystal orientation permits the integration of the transistor 54 with the field-effect transistor 42 and/or the bipolar junction transistor 44 on the same semiconductor substrate 10 absent a complex manufacturing process, such as wafer bonding, or the use of an engineered or hybrid substrate (e.g., an SOI substrate with one or more crystal orientations for the device layer), which may be considered to be an acceptable trade-off for poorer electrical performance.

Figure 6:
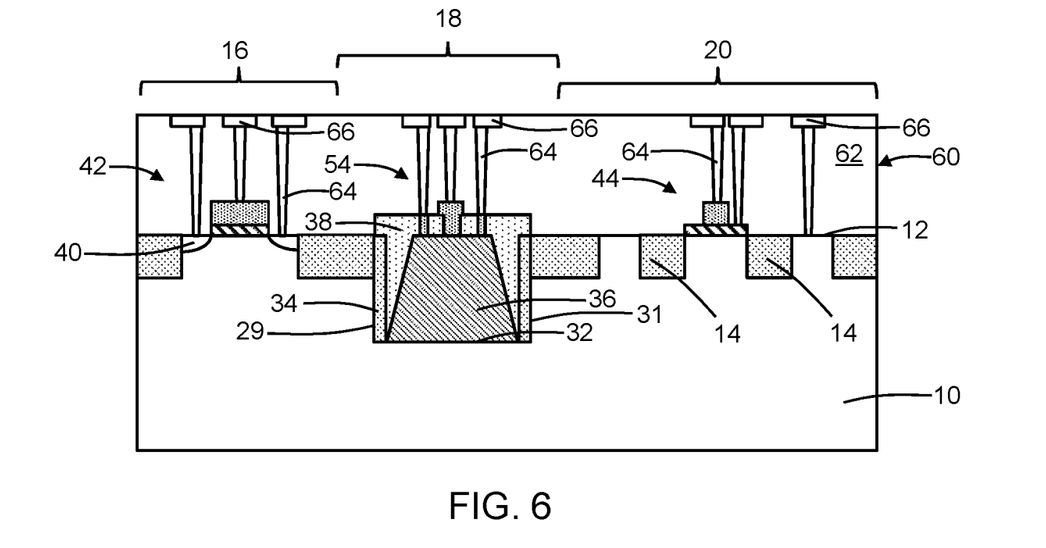

With reference to FIG. 6 in which like reference numerals refer to like features in FIG. 5 and at a subsequent fabrication stage of the processing method, middle-of-line processing and back-end-of-line processing follow, which includes formation of contacts, vias, and wiring for an interconnect structure 60 positioned over the semiconductor substrate 10 and above the transistors 42, 44, 54. Various metallization levels, such as a first metallization (M1) level, of the interconnect structure 60 may be formed that are coupled by the contact level with the field-effect transistor 42, the bipolar junction transistor 44, and the transistor 54. In that regard, the interconnect structure 60 may include one or more dielectric layers 62, a metallization level having metal lines 66, and a contact level having contacts 64 that couple the metal lines 66 to the field-effect transistor 42, the bipolar junction transistor 44, and the transistor 54.

Figure 7:
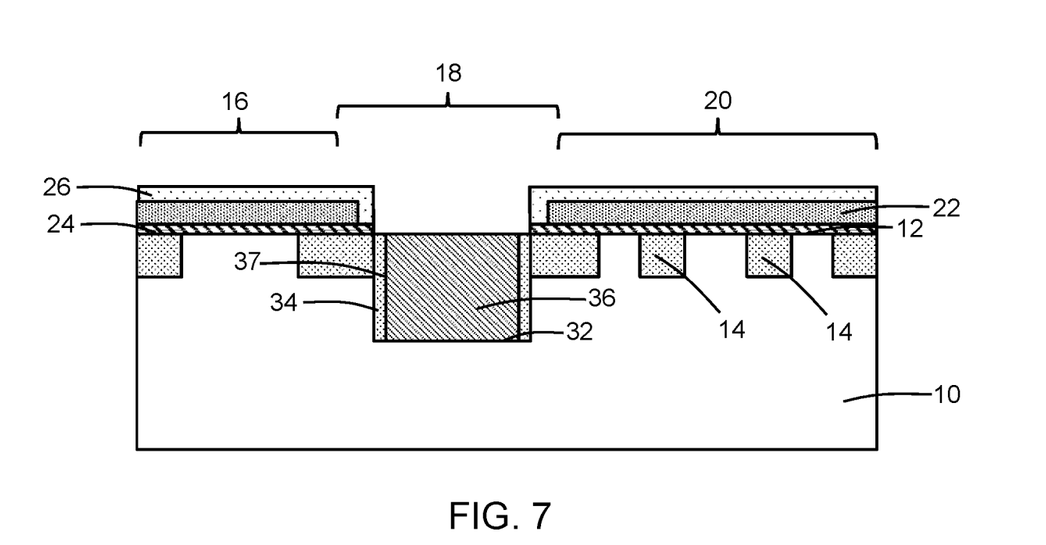
FIG. 7 is a cross-sectional view of a structure in accordance with an alternative embodiment of the invention.

With reference to FIG. 7 and in accordance with alternative embodiments, the sidewalls 37 of the layer stack 36 may be coextensive with the trench sidewalls 29, 31 and, in this instance, the trench 30 may be fully filled by the layer stack 36. Growth conditions may be selected to impart a given shape to the layer stack 36. Processing may continue as described in connection with FIGS. 4-6.

Figure 8:
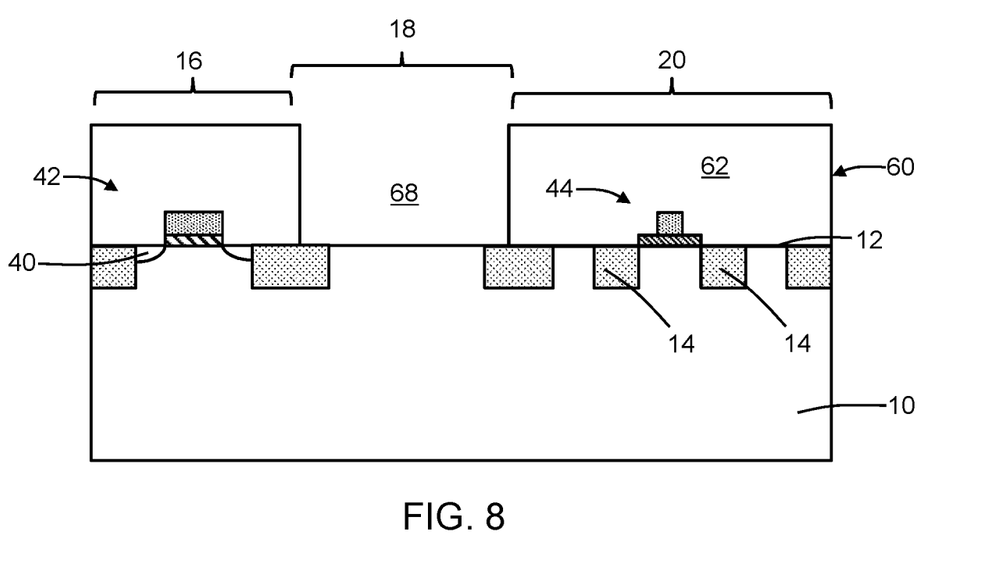
FIGS. 8 and 9 are cross-sectional views of a structure at successive fabrication stages of a processing method in accordance with an alternative embodiment of the invention.

With reference to FIG. 8 and in accordance with alternative embodiments, the trench 30, the layer stack 36, and the transistor 54 may be fully formed after the completion of the formation of the field-effect transistor 42 and the bipolar junction transistor 44. In that regard, the one or more dielectric layers 62 may be formed and patterned to provide an opening 68 defining a pathway to the top surface 12 of the semiconductor substrate 10 in device region 18. In the representative embodiment, the opening 68 is formed before forming the contacts 64 and metal lines 66. In an embodiment, the opening 68 may be formed after forming the contacts of the contact level that are coupled to the field-effect transistor 42 and the bipolar junction transistor 44. In an embodiment, the opening 68 may be formed after forming the metal lines 66 of the first metallization level and the contacts 64 of the contact level coupling the metal lines 66 to the field-effect transistor 42 and the bipolar junction transistor 44.

Figure 9:
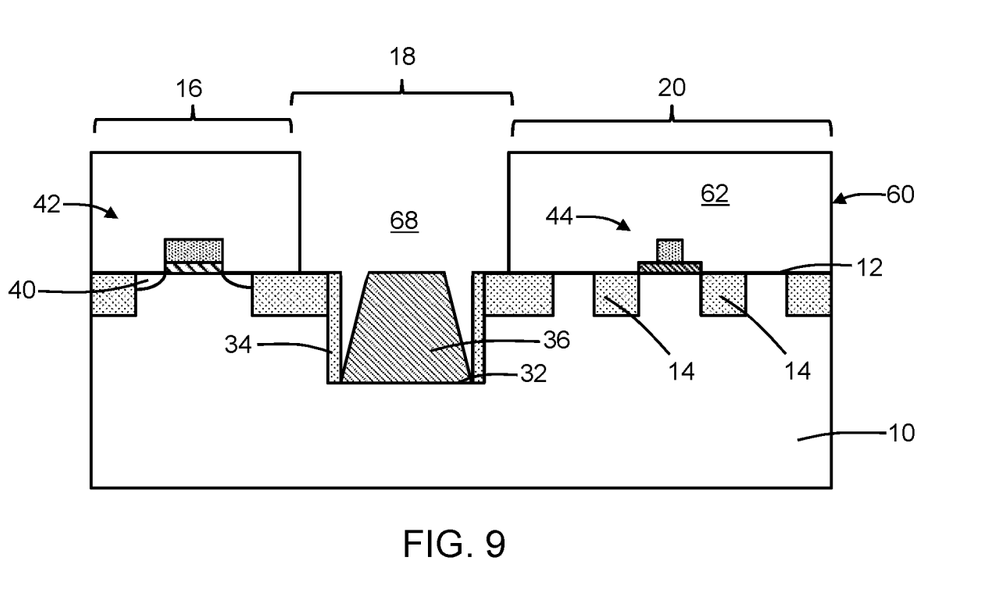

With reference to FIG. 9 in which like reference numerals refer to like features in FIG. 8 and at a subsequent fabrication stage of the processing method, the trench 30 is subsequently formed in the semiconductor substrate 10 at the location of the opening 68 in the one or more dielectric layers 62. The sidewall spacers 34, the layer stack 36, and the transistor 54 are subsequently formed using the trench 30 in the semiconductor substrate 10. The opening 68 may be refilled with dielectric material after forming the transistor 54, and the interconnect structure 60 may be completed by forming the contacts 64 and metal lines 66 coupled to the transistor 54.

Figure 10:
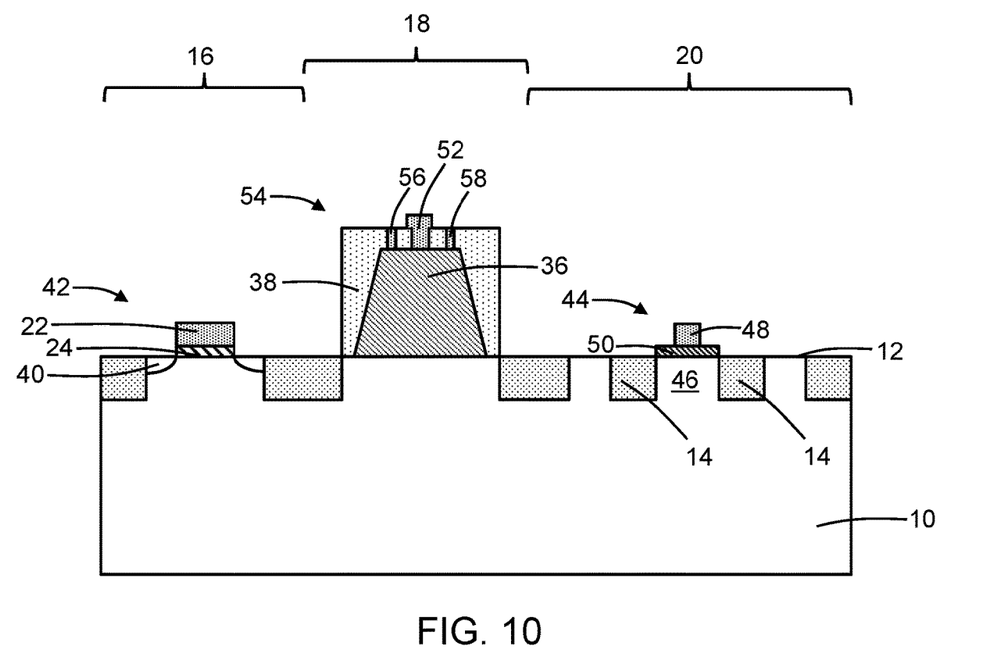
FIG. 10 is a cross-sectional view of a structure in accordance with an alternative embodiment of the invention.

With reference to FIG. 10 and in accordance with alternative embodiments, the layer stack 36 may be formed on the top surface 12 of the semiconductor substrate 10 without the prior formation of the trench 30. By forgoing trench formation, the layer stack 36 and the transistor 54 formed using the layer stack 36 may be located in the same plane as the field-effect transistor 42 and the bipolar junction transistor 44. More specifically, the layer stack 36, the gate structure of the field-effect transistor 42, and the emitter 48 and the base layer 50 of the bipolar junction transistor 44 may be positioned on the top surface 12, which may be considered to provide a common plane for the transistors 42, 44, 54.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A structure comprising:
  a bulk semiconductor substrate comprising a single-crystal semiconductor material having a diamond crystal lattice structure and a <111> crystal orientation, the bulk semiconductor substrate having a first device region and a second device region;
  a first CMOS transistor in the single-crystal semiconductor material of the first device region of the bulk semiconductor substrate; and a non-CMOS transistor in the second device region of the bulk semiconductor substrate, the non-CMOS transistor including a layer stack on the single-crystal semiconductor material of the bulk semiconductor substrate, and the layer stack including a layer comprising a III-V compound semiconductor material.

2. The structure of claim 1 wherein the single-crystal semiconductor material is single-crystal silicon.

3. The structure of claim 1 wherein the III-V compound semiconductor material is gallium nitride.

4. The structure of claim 1 wherein the III-V compound semiconductor material of the layer stack has a crystal structure that is substantially single crystal.

5. The structure of claim 1 wherein the bulk semiconductor substrate has a top surface, and the first CMOS transistor is a field-effect transistor including a source/drain region positioned in the bulk semiconductor substrate at least in part beneath the top surface.

6. The structure of claim 5 wherein the bulk semiconductor substrate has a third device region comprising the single-crystal semiconductor material, and further comprising:
a bipolar junction transistor in the third device region of the bulk semiconductor substrate, the bipolar junction transistor including a terminal positioned in the bulk semiconductor substrate at least in part beneath the top surface.

7. The structure of claim 1 wherein the bulk semiconductor substrate has a top surface, and the first CMOS transistor is a bipolar junction transistor including a terminal positioned in the bulk semiconductor substrate at least in part beneath the top surface.

8. The structure of claim 1 wherein the bulk semiconductor substrate has a third device region comprising the single-crystal semiconductor material, and further comprising:
a second CMOS transistor in the third device region of the bulk semiconductor substrate,
wherein the first CMOS transistor and the second CMOS transistor are different transistor types.

9. The structure of claim 1 wherein the bulk semiconductor substrate has a top surface, and the layer stack is positioned on the top surface of the bulk semiconductor substrate.

10. The structure of claim 9 wherein the top surface of the bulk semiconductor substrate is planar in the first device region and in the second device region, and the first CMOS transistor includes a device layer positioned on the top surface of the bulk semiconductor substrate.

11. The structure of claim 1 wherein the bulk semiconductor substrate has a first surface and a trench extending from the first surface into the bulk semiconductor substrate, and the layer stack is positioned on the bulk semiconductor substrate inside the trench.

12. The structure of claim 11 wherein the bulk semiconductor substrate has a second surface at a bottom of the trench, and the layer stack is positioned on the second surface.

13. The structure of claim 11 further comprising:
a shallow trench isolation region in the bulk semiconductor substrate, the shallow trench isolation region laterally positioned between the first device region and the second device region,
wherein the trench extends to a greater depth into the bulk semiconductor substrate relative to the first surface than the shallow trench isolation region.

14. The structure of claim 11 wherein the trench includes a plurality of sidewalls, and further comprising:
a spacer on each of the plurality of sidewalls, the spacer comprised of a dielectric material.

15. The structure of claim 1 further comprising:
an interconnect structure positioned over the bulk semiconductor substrate, the interconnect structure including a first plurality of contacts coupled to the first CMOS transistor and a second plurality of contacts coupled to the non-CMOS transistor.

16. The structure of claim 1 further comprising:
a shallow trench isolation region in the bulk semiconductor substrate, the shallow trench isolation region laterally positioned between the first device region and the second device region.

17. A method comprising:
providing a bulk semiconductor substrate comprising a single-crystal semiconductor material having a diamond crystal lattice structure and a <111> crystal orientation;
forming a CMOS transistor in a first device region of the bulk semiconductor substrate, wherein the first device region comprises the single-crystal semiconductor material;
forming a layer stack including a layer comprising a III-V compound semiconductor material in a second device region of the bulk semiconductor substrate, wherein the second device region comprises the single-crystal semiconductor material; and
forming a non-CMOS transistor using the layer stack.

18. The method of claim 17 wherein the single-crystal semiconductor material is single-crystal silicon, and the III-V compound semiconductor material is gallium nitride.

19. The method of claim 17 further comprising:
forming a trench extending from a first surface into the bulk semiconductor substrate to a second surface at a bottom of the trench,
wherein the layer stack is positioned on the second surface of the bulk semiconductor substrate inside the trench.

20. The method of claim 17 further comprising:
forming a shallow trench isolation region in the bulk semiconductor substrate,
wherein the shallow trench isolation region is laterally positioned between the first device region and the second device region.

* * * * *